United States Patent [19]
Yoon

[11] Patent Number: 5,610,541
[45] Date of Patent: Mar. 11, 1997

[54] RESET SIGNAL GENERATION METHOD AND APPARATUS FOR USE WITH A MICROCOMPUTER

[75] Inventor: Tae-Goon Yoon, Seoul, Rep. of Korea

[73] Assignee: Daewoo Electronics Co., Ltd., Seoul, Rep. of Korea

[21] Appl. No.: 499,439

[22] Filed: Jul. 6, 1995

[30] Foreign Application Priority Data

Aug. 24, 1994 [KR] Rep. of Korea ................. 94-20841

[51] Int. Cl.$^6$ ........................................... H03L 7/00
[52] U.S. Cl. ........................ 327/143; 327/142; 327/198
[58] Field of Search ................................ 327/143, 142, 327/198

[56] References Cited

U.S. PATENT DOCUMENTS 5,428,765  6/1995  Moore ........................... 327/142

*Primary Examiner*—Margaret R. Wambach
*Attorney, Agent, or Firm*—Pennie & Edmonds

[57] ABSTRACT

A novel apparatus, for use with a microcomputer, for detecting an erroneous input clock signal and/or an input supply voltage to the microcomputer and providing a reliable reset signal thereto, comprises a converter for converting a differential signal representing the phase difference between the input clock signal and a feedback clock signal into a differential voltage and for generating a reference clock signal having a number of logic high and logic low states in response to the differential voltage, wherein the feedback clock signal represents a previously generated reference clock signal; a first comparator for comparing the differential voltage and the input supply voltage with first and second predetermined threshold values, respectively, to detect first and second error signals and for generating an error decision signal based on the first and the second error signals; a circuit, responsive to the error decision signal and a counting value state signal denoting a previously provided reset signal, for selectively producing a zero value, a first or a second non-zero counted value; and a second comparator for comparing the zero value, the first or the second non-zero counted value with a third predetermined threshold value, to thereby provide the reliable reset signal to the microcomputer for the initialization thereof, and to the circuit as the counting value state signal.

17 Claims, 1 Drawing Sheet

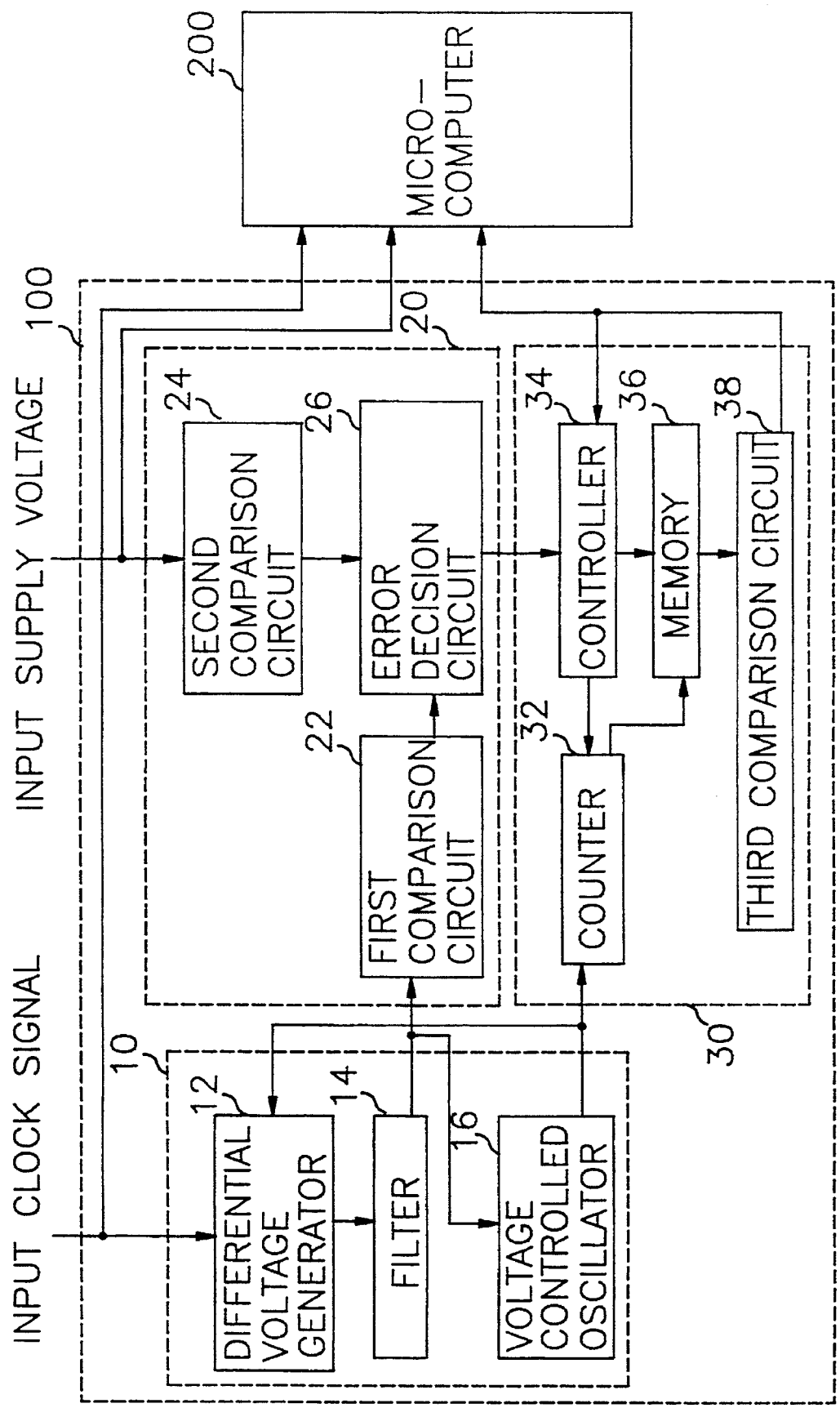

RESET SIGNAL GENERATION METHOD AND APPARATUS FOR USE WITH A MICROCOMPUTER

FIELD OF THE INVENTION

The present invention relates to a reset signal generation method and apparatus for use with a microcomputer; and, more particularly, to a method and apparatus capable of detecting an erroneous input supply voltage and/or an input clock signal thereto and effectively providing a reliable reset signal using an improved reset signal generation technique.

BACKGROUND OF THE INVENTION

As is well known, a reset signal generation device is widely utilized in various electronic/electrical applications. The conventional reset signal generation device is employed with various electronic equipment, e.g., a microcomputer, in order to allow the microcomputer to effectively carry out a series of processes therein. In general, the microcomputer requires a stable input supply voltage and a correct input clock signal so as to perform all of the processes without incurring errors or malfunction therein.

However, the input supply voltage and/or the input clock signal may be sometimes unstable or incorrect due to, e.g., an instantaneous power failure, an overload at the power supply and the like, resulting in errors or malfunctioning thereof. Consequently, to detect an erroneous input supply voltage and/or input clock signal to the microcomputer and produce a stable reset signal, various reset signal generation devices have been proposed.

One of such devices is disclosed in U.S. Pat. No. 4,434,403, which comprises an error detection circuit and a delay circuit to monitor both the input supply voltage and the input clock pulses and produce a stable reset signal if a low input supply voltage is detected or one of the input clock pulses is missed.

Since, however, the device has to employ various analog circuitries, it is rather difficult to precisely adjust the circuit parameters to obtain a reliable reset signal. Further, it is difficult to alter or update the generation time and the release time of a reset signal as the device comprises the analog circuitries which are intrinsically set by an integrated circuit(IC) to provide a stable reset signal.

SUMMARY OF THE INVENTION

It is, therefore, a primary object of the invention to provide a method and apparatus for use with a microcomputer capable of detecting an erroneous input supply voltage and/or an input clock signal thereto and effectively providing a reliable reset signal using an improved reset signal generation technique, thereby improving the performance of the microcomputer.

In accordance with one aspect of the invention, there is provided an improved method, for use with a microcomputer, for detecting an erroneous input clock signal and/or an input supply voltage to the microcomputer and for providing a reliable reset signal to the microcomputer, comprising the steps of:

converting a differential signal representing the phase difference between the input clock signal and a feedback clock signal into a differential voltage and generating a reference clock signal having a number of logic high and logic low states in response to the differential voltage, wherein the feedback clock signal represents a previously generated reference clock signal;

comparing the differential voltage and the input supply voltage with first and second predetermined threshold values, respectively, to detect first and second error signals and generating an error decision signal based on the first and the second error signals;

selectively producing a zero value, a first or a second non-zero counted value in response to the error decision signal and a counting value state signal denoting a previously provided reset signal; and comparing the zero value, the first or the second non-zero counted value with a third predetermined threshold value, to thereby provide the reliable reset signal to the microcomputer for the initialization thereof, and to the step for producing the zero value, the first or the second non-zero counted value as the counting value state signal.

In accordance with another aspect of the invention, there is provided an improved apparatus, for use with a microcomputer, for detecting an erroneous input clock signal and/or an input supply voltage to the microcomputer and for providing a reliable reset signal to the microcomputer, which comprises:

means for converting a differential signal representing the phase difference between the input clock signal and a feedback clock signal into a differential voltage and for generating a reference clock signal having a number of logic high and logic low states in response to the differential voltage, wherein the feedback clock signal represents a previously generated reference clock signal;

means for comparing the differential voltage and the input supply voltage with first and second predetermined threshold values, respectively, to detect first and second error signals and for generating an error decision signal based on the first and the second error signals;

means, responsive to the error decision signal and a counting value state signal denoting a previously provided reset signal, for selectively producing a zero value, a first or a second non-zero counted value; and means for comparing the zero value, the first or the second non-zero counted value with a third predetermined threshold value, to thereby provide the reliable reset signal to the microcomputer for the initialization thereof, and to means for producing the zero value, the first or the second non-zero counted value as the counting value state signal.

BRIEF DESCRIPTION OF THE DRAWING

The above and other objects and features of the present invention will become apparent from the following description given with reference to the acompanying drawing, which is a block diagram illustrating the novel reset signal generation method and apparatus of the invention.

DETAILED DESCRIPTION OF THE PREFERRED EMBODIMENTS

Referring to the drawing, there is shown a block diagram of a novel reset signal generation apparatus 100 of the present invention for use with a microcomputer 200. The inventive reset signal generation apparatus 100 comprises a phase locked loop(PLL) circuit 10, an error signal detector 20, a reset signal generator 30, wherein the PLL circuit 10 includes a differential voltage generator 12, a filter 14 and a voltage controlled oscillator(VCO) 16.

An input clock signal with certain pulse widths is applied to the differential voltage generator 12 and the microcomputer 200. The differential voltage generator 12 serves to generate a differential signal representing the phase difference between the input clock signal and a feedback clock signal from the VCO 16 and convert the differential signal into its corresponding differential voltage. The differential signal and the differential voltage can be obtained by using, e.g., an EX-OR gate and a phase to voltage converter commonly known in the art, respectively.

The differential voltage is then provided to the filter 14, e.g., a low pass filter, which serves to derive a filtered differential voltage, which eliminates noises such as spurious high frequency components contained therein, by performing the filtering thereof. The filtered differential voltage is supplied from the filter 14 to the VCO 16 and the error signal detector 20.

The VCO 16, as well known in the art, generates a reference clock signal from an oscillator(not shown) thereof in response to the filtered differential voltage from the filter 14. The reference clock signal is provided to the reset signal generator 30 and the differential voltage generator 12 as a feedback clock signal to be used in deriving a next differential signal present between the input and the feedback clock signals.

As shown in the drawing, the error signal detector 20 of the invention includes first and second comparison circuits 22 and 24 and an error decision circuit 26. The first comparison circuit 22 compares the filtered differential voltage from the filter 14 with a first predetermined threshold value TH1, prestored in a memory(not shown) thereof, to thereby provide a first error signal to the error decision circuit 26, wherein the first predetermined threshold value TH1 is a positive integer. That is, the output from the first comparison circuit 22 is a first logic high error signal if the filtered differential voltage is smaller than the first predetermined threshold value TH1, i.e., the input clock signal is considered to be normal; and a first logic low error signal if the filtered differential voltage is equal to or larger than the first predetermined threshold value TH1, i.e., the input clock signal is regarded as an erroneous one.

In the meantime, an input supply voltage, e.g., a DC voltage, is inputted to the second comparison circuit 24 and the microcomputer 200. The second comparison circuit 24 derives a second error signal for the input supply voltage in a similar fashion as in the first comparison circuit 22. In other words, the second comparison circuit 24 compares the input supply voltage with a second predetermined threshold value TH2, TH2 being a positive integer prestored in a memory(not shown) thereof, thereby providing a second error signal to the error decision circuit 26. More specifically, the output from the second comparison circuit 24 is a second logic high error signal if the input supply voltage is equal to or larger than the second predetermined threshold value TH2, i.e., the input supply voltage is determined to be normal; and a second logic low error signal if the input supply voltage is smaller than the second predetermined threshold value TH2, i.e., the input supply voltage is found to be an erroneous one. It should be appreciated that the first and the second predetermined threshold values TH1 and TH2 can be determined based on the required performance of the reset signal generation apparatus. Subsequently, the first error signal from the first comparison circuit 22 and the second error signal from the second comparison circuit 24 are fed to the error decision circuit 26.

The error decision circuit 26, which receives the first and the second error signals, serves to properly combine the two error signals and generate an error decision signal indicating whether both the pulse state of the input clock signal and the voltage level of the input supply voltage are normal or not.

In a preferred embodiment of the present invention, if both the first and the second error signals are in logic high levels, the error decision circuit 26 generates a logic high error decision signal; and if both the first and the second error signals are not in logic high levels, it generates a logic low error decision signal. As can be seen from the above, the error decision circuit 26 can be easily implemented by employing, e.g., an AND gate well known in the art. As is known to those skilled in the art, with an AND gate, a logic low error decision signal would be generated when either the first or the second error signal is not at a logic high level. Thereafter, the reference clock signal from the VCO 16 and the error decision signal from the error decision circuit 26 are simultaneously provided to the reset signal generator 30 of the present invention.

The reset signal generator 30, which comprises a counter 32, a controller 34, a memory 36 and a third comparison circuit 38, serves to effectively generate a reliable reset signal by utilizing a novel reset signal generation scheme of the invention.

In the inventive reset signal generation scheme, the controller 34 is responsive to the error decision signal from the error decision circuit 26 and a counting value state signal from the third comparison circuit 38 and controls the operation of the counter 32 and the memory 36, said counting value state signal denoting a previously generated reset signal from the third comparison circuit 38.

That is to say, in case the input from the error decision circuit 26 to the controller 34 is the logic low error decision signal irrespective of the counting value state signal from the third comparison circuit 38, it issues first and second control signals CS1 and CS2 to the counter 32 and the memory 36, respectively. In response to the first control signal CS1, the counter 32 resets a previously counted non-zero value and provides a zero value to the memory 36 for the storage thereof; and in response to the second control signal CS2, the memory 36 retrieves the zero value to the third comparison circuit 38.

And then, the third comparison circuit 38 compares the zero value from the memory 36 with a third predetermined threshold value TH3 prestored in a memory(not shown) thereof, to thereby produce a logic high reset signal, wherein the third threshold value TH3 is a positive integer. To hold all of processes in the microcomputer 200, the produced logic high reset signal is then provided from the third comparison circuit 38 thereto; and to use it in controlling a next process, it is fed as a logic high counting value state signal therefrom to the controller 34.

Thereafter, in case inputs from the error decision circuit 26 and the third comparison circuit 38 to the controller 34 are the logic high error decision signal and the logic high counting value state signal, respectively, i.e., both the input clock signal and the input supply voltage are returned to normal conditions, it issues a third and the second control signals CS3 and CS2 to the counter 32 and the memory 36, respectively. In such case, the counter 32 serves to perform the counting operation for logic high states of the reference clock signal from the VCO 16 to thereby provide a non-zero counted value to the memory 36 to be stored therein in response to the third control signal CS3; and the non-zero counted value stored therein is retrieved to the third comparison circuit 38 in response to the second control signal CS2.

The third comparison circuit 38 then compares the non-zero counted value with the third threshold value TH3 to thereby generate a reliable reset signal. In a preferred embodiment of the invention, if the non-zero counted value is smaller than the third threshold value TH3, the third comparison circuit 38 provides a logic high reset signal to the microcomputer 200 to thereby still maintain all of the processes therein, and to the controller 34 as a logic high counting value state signal. These counting and comparing operations are sequentially carried out until the non-zero counted value becomes equal to the third threshold value TH3. Specifically, a previously counted non-zero value stored in the memory 36 is updated with a newly counted non-zero value by providing the newly counted non-zero value from the counter 32 to the memory 36 in response to the third control signal CS3; and the updated non-zero counted value stored therein is read in response to the second control signal CS2. And the read non-zero counted value is compared with the third threshold value TH3 at the third comparison circuit 38.

After performing the counting and the comparing operations for a certain time period until the read non-zero counted value becomes equal to the third threshold value TH3, the third comparison circuit 38 provides a logic low reset signal to the microcomputer 200 to initialize all of the processes therein and to the controller 34 as a logic low counting value state signal.

Based on the logic high error decision signal from the error decision circuit 26 and the logic low counting value state signal from the third comparison circuit 38, the controller 34 provides a fourth and the second control signals CS4 and CS2 to the counter 32 and the memory 36, respectively. In response to the fourth control signal CS4, the counter 32 stops the counting operation; and in response to the second control signal CS2, the newly updated non-zero counted value stored in the memory 36 is provided to the third comparison circuit 38. Subsequently, the third comparison circuit 38 produces logic low reset signals in succession until the error decision signal from the error decision circuit 26 to the controller 34 becomes the logic low level. As can be seen from the above, the logic high or logic low reset signal is continuously provided to the microcomputer 200 as long as the operation thereof continues.

It should be noted that the third predetermined threshold value TH3 can be preferably determined based on the required performance of the reset signal generation apparatus. As a result, the present invention is capable of providing a reliable reset signal by using the inventive reset signal generation circuit comprising only digital circuits, and advantageously changing or updating their parameter values, thereby improving the performance of the microcomputer.

While the present invention has been shown and described with respect to the particular embodiment, it will be apparent to those skilled in the art that many changes and modifications may be made without departing from the spirit and scope of the invention as defined in the appended claims.

What is claimed is:

1. A method, for use with a microcomputer, for detecting at least one of an erroneous input clock signal and an erroneous input supply voltage to the microcomputer and for providing a reliable reset signal to the microcomputer, comprising the steps of:

converting a differential signal representing a phase difference between the input clock signal and a feedback clock signal into a differential voltage and generating a reference clock signal having a number of logic high and logic low states in response to the differential voltage, wherein the feedback clock signal represents a previously generated reference clock signal;

comparing the differential voltage and the input supply voltage with first and second predetermined threshold values, respectively, to detect first and second error signals and generating an error decision signal based on the first and the second error signals;

selectively producing a zero value, a first or a second non-zero counted value in response to the error decision signal: and a counting value state signal denoting a previously provided reset signal; and comparing the zero value, the first or second non-zero counted value with a third predetermined threshold value, to thereby provide the reliable reset signal to the microcomputer for the initialization thereof, and provide the counting value state signal.

2. The method as recited in claim 1, wherein the step for producing the zero value, the first or the second non-zero counted value includes the steps of:

resetting a previously updated non-zero counted value if the error decision signal is a logic low signal irrespective of the counting value state signal, to thereby generate the zero value;

storing the zero value to be updated;

counting up the number of the logic high states of the reference clock signal in succession if both the error decision signal and the counting value state signal are logic high signals, to produce a non-zero counted value and update the stored value with the non-zero counted value by providing it to the storing step, thereby producing a updated non-zero counted value as the first non-zero counted value; and generating a newly updated non-zero counted value as the second non-zero counted value if the error decision signal is the logic high signal and the counting value state signal becomes a logic low signal.

3. An apparatus, for use with a microcomputer, for detecting at least one of an erroneous input clock signal and an erroneous input supply voltage to the microcomputer and for providing a reliable reset signal to the microcomputer, which comprises:

means for converting a differential signal representing the phase difference between the input clock signal and a feedback clock signal into a differential voltage and for generating a reference clock signal having a number of logic high and logic low states in response to the differential voltage, wherein the feedback clock signal represents a previously generated reference clock signal;

means for comparing the differential voltage and the input supply voltage with first and second predetermined threshold values, respectively, to detect first and second error signals and for generating an error decision signal based on the first and the second error signals;

means, responsive to the error decision signal and a counting value state signal denoting a previously provided reset signal, for selectively producing a zero value, a first or second non-zero counted value; and means for comparing the zero value, the first or the second non-zero counted value with a third predetermined threshold value, to thereby provide the reliable reset signal to the microcomputer for the initialization thereof, and also to thereby provide the reliable reset signal to the means for producing the zero value, the first or the second non-zero counted value as the counting value state signal.

4. The apparatus as recited in claim 3, wherein means for producing the zero value, the first or the second non-zero counted value includes:

means for resetting a previously updated non-zero counted value if the error decision signal is a logic low signal irrespective of the counting value state signal, to thereby generate the zero value;

means for storing the zero value to be updated;

means for counting up the number of the logic high states of the reference clock signal in succession if both the error decision signal and the counting value state signal are logic high signals, to produce a non-zero counted value and update the stored value with the non-zero counted value by providing it to the storing means, thereby producing a updated non-zero counted value as the first non-zero counted value; and means for generating a newly updated non-zero counted value as the second non-zero counted value if the error decision signal is the logic high signal and the counting value state signal becomes a logic low signal.

5. A method for resetting a microcomputer, comprising the steps of:

(a) detecting an error in an input clock signal to the microcomputer;

(b) detecting an error in an input supply voltage to the microcomputer;

(c) if an error is detected in either one of the input clock signal and the input supply voltage, providing the microcomputer with a first reset signal in order to hold processes being carried out in the microcomputer; and (d) if no error is detected in either of the input clock signal and the input supply voltage for a predetermined period after providing the first reset signal, generating a second reset signal to provide it to the microcomputer for the initialization thereof.

6. The method as recited in claim 5, wherein said step (a) for detecting the error in the input clock signal includes the steps of:

(a1) converting a differential signal representing the phase difference between the input clock signal and a feedback clock signal into a differential voltage, wherein the feedback clock signal represents a previously generated reference clock signal;

(a2) generating a reference clock signal having a plural number of logic high and logic low states in response to the differential voltage; and (a3) detecting the error in the input clock signal by comparing the differential voltage with a first predetermined threshold value TH1, wherein the input clock signal is considered to be normal if the differential voltage is smaller than TH1; and erroneous, if otherwise.

7. The method as recited in claim 6, wherein said step (b) for detecting the error in the input supply voltage includes the step of:

(b1) comparing the input supply voltage with a second predetermined threshold value TH2, wherein the input supply voltage is determined to be normal if the input supply voltage is larger than or equal to TH2; and erroneous, if otherwise.

8. The method as recited in claim 6, wherein said step (d) for generating the second reset signal includes the steps of:

(d1) after providing the first reset signal, counting the number of logic high reference clock signals in succession during which no error is detected from either of the input clock signal and the input supply voltage to thereby provide a counted value; and (d2) comparing the counted value with a third predetermined threshold value TH3 and generating the second reset signal when the counted value becomes equal to TH3, the third threshold value TH3 being a positive integer.

9. The method as recited in claim 6, wherein said step (a2) for generating the reference clock signal is carried out through the use of a voltage controlled oscillator.

10. A method for resetting a microcomputer using a reset signal, said reset signal assuming one of a first and a second reset value at any instant, said method comprising the steps of:

generating an error signal, said error signal having one of two error values, a first error value reflecting the occurrence of an error in at least one of an input clock signal and an input supply voltage, and a second error value indicating the absence of an error;

generating a first reset signal at the first reset value in response to said error signal having a first error value;

providing said first reset signal at the first reset value to the microcomputer for a predetermined period of time, to hold processes therein;

generating a second reset signal at the second reset value upon completion of said first predetermined period of time only if no further errors are detected in either said input clock signal or said input supply voltage during said first predetermined period of time; and providing said second reset signal at the second reset value to the microcomputer for the initialization thereof.

11. The method of claim 10 wherein the step of generating the first reset signal at the first reset value comprises the steps of:

providing a counter responsive to a clock input;

generating at least one control signal in response to said error signal having the first error value;

providing a first counter value to a comparison circuit in response to said at least one control signal; and comparing said first counter value with a predetermined threshold, and outputting said first reset signal at the first reset value in response thereto.

12. The method of claim 11 further comprising the step of resetting the counter to a zero value before the step of providing a first counter value.

13. The method of claim 10 wherein the step of generating the second reset signal at the second reset value comprises the steps of:

providing a counter responsive to a clock input;

generating at least one control signal in response to said error signal having a second error value, and also to a counting value state signal, said counting value state signal being a previous reset signal;

providing a second counter value to a comparison circuit in response to said at least one control signal; and comparing said second counter value with a predetermined threshold, and outputting said second reset signal at the second reset value in response thereto.

14. The method of claim 13 wherein said previous reset signal is at the first reset value.

15. The method of claim 10 wherein the first and second reset signals each are generated by:

providing a counter responsive to a clock input;

generating at least one control signal in response to said error signal and also to a counting value state signal, said counting value state signal being a previous reset signal;

providing a counter value to a comparison circuit in response to said at least one control signal; and comparing said counter value with a predetermined threshold, and outputting said reset signal in response thereto.

16. The method of claim 15 wherein the clock input to the counter is provided by a voltage controlled oscillator.

17. The method of claim 15 wherein:

said error signal and said counting value state signal are provided to a controller, and said controller generates a first control signal to store said counter value in a memory means, and generates a second control signal to retrieve said stored counter value from said memory means into said comparison circuit.

* * * * *